(12) United States Patent
Maa et al.

(10) Patent No.: US 11,082,013 B2
(45) Date of Patent: Aug. 3, 2021

(54) METHOD OF REDUCING MEMORY EFFECT OF POWER AMPLIFIER

(71) Applicant: MEDIATEK INC., Hsin-Chu (TW)

(72) Inventors: Ching-Shyang Maa, Tainan (TW); Chun-Hsien Peng, Nantou County (TW); Hua-Lung Yang, Taipei (TW); I-No Liao, Hsinchu County (TW); Chen-Jui Hsu, Hsinchu County (TW); Jen-Yang Liu, Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 15/975,783

(22) Filed: May 10, 2018

(65) Prior Publication Data

US 2018/0331662 A1 Nov. 15, 2018

Related U.S. Application Data

(60) Provisional application No. 62/505,149, filed on May 12, 2017.

(51) Int. Cl.
*H03F 3/04* (2006.01)
*H03F 1/32* (2006.01)
*H03F 3/21* (2006.01)
*H03F 3/19* (2006.01)
*H03F 1/30* (2006.01)
*H03F 1/02* (2006.01)
*H03F 3/24* (2006.01)

(52) U.S. Cl.
CPC ......... *H03F 1/3258* (2013.01); *H03F 1/0211* (2013.01); *H03F 1/0261* (2013.01); *H03F 1/30* (2013.01); *H03F 3/19* (2013.01); *H03F 3/21* (2013.01); *H03F 3/245* (2013.01); *H03F 2200/18* (2013.01); *H03F 2200/447* (2013.01); *H03F 2200/451* (2013.01); *H03F 2200/468* (2013.01); *H03F 2201/3209* (2013.01); *H03F 2201/3224* (2013.01); *H03F 2201/3233* (2013.01)

(58) Field of Classification Search
CPC ...... H03F 1/3258; H03F 1/0211; H03F 3/245; H03F 1/0261; H03F 1/30; H03F 3/21; H03F 3/19; H03F 2200/447; H03F 2200/18; H03F 2201/3233; H03F 2200/451; H03F 2201/3209; H03F 2201/3224; H03F 2200/468
USPC ........ 330/127, 129, 136, 149, 289, 296, 297
See application file for complete search history.

(56) References Cited

U.S. PATENT DOCUMENTS

| | | | | |
|---|---|---|---|---|
| 5,880,633 A | * | 3/1999 | Leizerovich | ......... H03F 1/0222 330/84 |
| 8,041,315 B2 | * | 10/2011 | Hamalainen | ......... H03F 1/0205 330/129 |
| 8,093,946 B2 | * | 1/2012 | Wimpenny | ........... H03F 1/0227 330/129 |

(Continued)

*Primary Examiner* — Khanh V Nguyen
(74) *Attorney, Agent, or Firm* — Winston Hsu

(57) ABSTRACT

A method of reducing memory effect of a power amplifier (PA), for a look-up table (LUT) based memory digital pre-distortion (DPD) circuit of an electronic device is disclosed. The method comprises generating a pre-distorted signal according to a LUT including parameters of an input signal amplitude and an input signal delay associated with a bandwidth of a signal inputted to the memory DPD circuit, and outputting the pre-distorted signal to the PA for improving the nonlinearity of the PA.

2 Claims, 3 Drawing Sheets

(56) References Cited

U.S. PATENT DOCUMENTS

| | | | |
|---|---|---|---|
| 8,665,017 B2* | 3/2014 | Onishi | H03F 1/02 |
| | | | 330/136 |
| 8,982,991 B2 | 3/2015 | Woo | |
| 8,989,307 B2 | 3/2015 | Zhou | |
| 9,093,960 B2* | 7/2015 | McCallister | H03F 1/3247 |
| 9,197,256 B2* | 11/2015 | Khlat | H03F 1/0227 |
| 9,219,445 B2* | 12/2015 | Nobbe | H03F 1/0227 |
| 9,331,645 B2* | 5/2016 | Lee | H03F 1/0227 |
| 9,680,434 B2* | 6/2017 | Yan | H03F 3/245 |
| 10,148,229 B2* | 12/2018 | Wimpenny | H04L 25/0286 |
| 2008/0171523 A1* | 7/2008 | Anderson | H03F 1/0205 |
| | | | 455/127.1 |
| 2012/0093050 A1* | 4/2012 | Rofougaran | H03F 1/0222 |
| | | | 370/311 |
| 2015/0236729 A1* | 8/2015 | Peng | H03F 3/24 |
| | | | 455/114.3 |
| 2016/0072530 A1* | 3/2016 | El-Hassan | H03F 1/0227 |
| | | | 455/114.2 |
| 2017/0093339 A1* | 3/2017 | Wu | H03F 3/195 |

* cited by examiner

METHOD OF REDUCING MEMORY EFFECT OF POWER AMPLIFIER

CROSS REFERENCE TO RELATED APPLICATIONS

This application claims the benefit of U.S. Provisional Application No. 62/505,149, filed on May 12, 2017 and entitled "An Efficient Current-Saving LUT-Based Memory DPD Apparatus", the contents of which are incorporated herein in their entirety.

BACKGROUND

There are power amplifiers (PAs) in the cell phones or base stations for amplifying signals in a wireless communication system. A trend in the cell phone's up-link signal to support the high data rate is to transmit wideband signal. However, wide bandwidth exhibits memory effect in power amplifier (PA). The memory effect causes PA nonlinearity along with time, and thus decreasing the PA performance (PA saturation). Thus, a memory digital pre-distortion (DPD) is introduced for PA linearization. One scheme used in the memory DPD includes polynomial model with least square (LS) algorithm. However, polynomial based memory DPD for solving memory effect of PA results in high complexity and high current consumption. In addition, polynomial based memory DPD cannot on-the-fly train a polynomial model for the PA as the PA characteristics varied.

SUMMARY

It is therefore an objective to provide a method of reducing memory effect of power amplifier with low complexity and current consumption in order to solve the abovementioned problems.

The present invention discloses a method of reducing memory effect of a power amplifier (PA), for a look-up table (LUT) based memory digital pre-distortion (DPD) circuit of an electronic device. The method comprises generating a pre-distorted signal according to a LUT including parameters of an input signal amplitude and an input signal delay associated with a bandwidth of a signal inputted to the memory DPD circuit, and outputting the pre-distorted signal to the PA for improving the linearity of the PA.

The present invention discloses a method of dynamically adjusting a supply voltage and bias for a power amplifier (PA) of the electronic device, for a PA controller of an electronic device. The method comprises determining a supply voltage and bias for the PA according to input signal power, peak-to-average power ratio (PAPR), input signal bandwidth, a detecting result of a sensor of the electronic device, an input signal quality, or any combination thereof.

The present invention discloses a method of reducing memory effect of a power amplifier (PA), for a look-up table (LUT) tracking circuit of an electronic device. The method comprises receiving a signal inputted to a memory digital pre-distortion (DPD) of the electronic device, and establishing a LUT with parameters of an input signal amplitude and input signal delay associated with a bandwidth of the received signal, wherein the establishing step comprises performing an auto-correlation of the received signal and a cross-correlation of the received signal and a signal outputted from the PA of the electronic device, and establishing the LUT with parameters of the input signal amplitude and input signal delay by an adaptive algorithm for the correlation and cross-correlation.

The present invention discloses an electronic device adapting a look-up table (LUT) based scheme for reducing memory effect of a power amplifier (PA). The electronic device comprises a LUT tracking circuit, for establishing a LUT with parameters of an input signal amplitude and input signal delay associated with a bandwidth of a signal inputted to a memory digital pre-distortion (DPD) of the electronic device, and the memory digital pre-distortion (DPD) circuit, for generating a pre-distorted signal to the PA according to the LUT.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
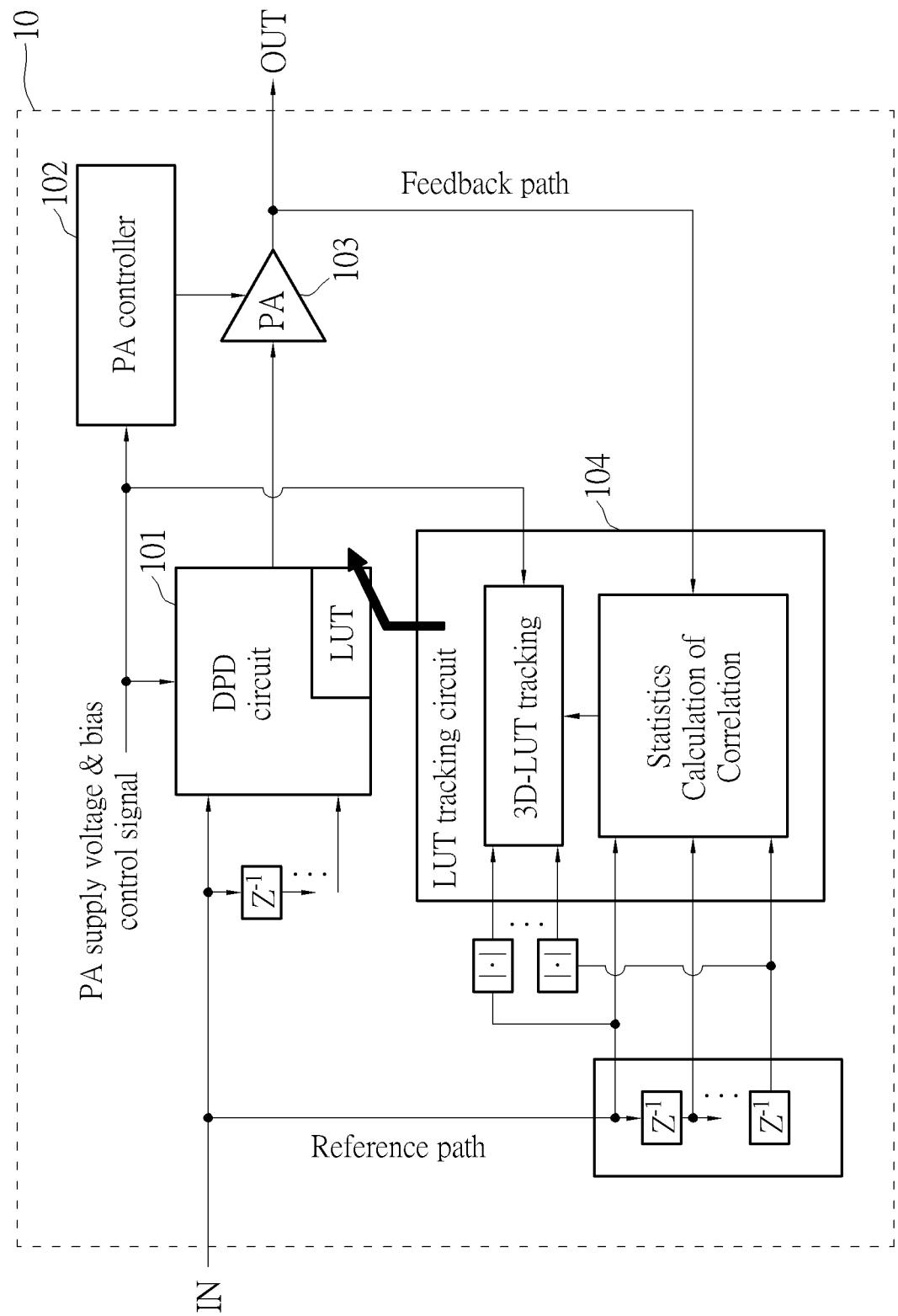
FIG. 1 is a schematic diagram of an exemplary communication device according to the present disclosure.

FIG. 1 illustrates a schematic diagram of an exemplary electronic device according to the present disclosure. The electronic device 10 can be a mobile phones, appliances, machine type devices, etc. compatible with wireless communications protocols, such as LTE and 5G specification. The electronic device 10 includes a memory digital pre-distortion (DPD) circuit 101, a power amplifier (PA) controller 102, a PA 103 and a look-up table (LUT) tracking circuit 104. The memory DPD circuit 101 is used for reducing memory effect of the PA 103 with a pre-distorted signal, wherein the pre-distorted signal is generated based on a LUT established by the LUT tracking circuit 104 and transmitted to the PA 103. The LUT tracking circuit 104 is used for performing a real-time tracking operation to generate the LUT, which provides mathematical descriptions of PA's nonlinear characteristic (e.g. amplitude modulation to amplitude modulation (AM-AM) distortion and/or amplitude modulation to phase modulated compensation (AM-PM) distortion and/or PA's memory effect), such that the memory DPD circuit 101 can generate the pre-distorted signal, which provides inversed nonlinear characteristic for the PA, according to the LUT. In addition, the PA controller 102 is used for generating a supply voltage and bias to the PA 103.

Figure 2:
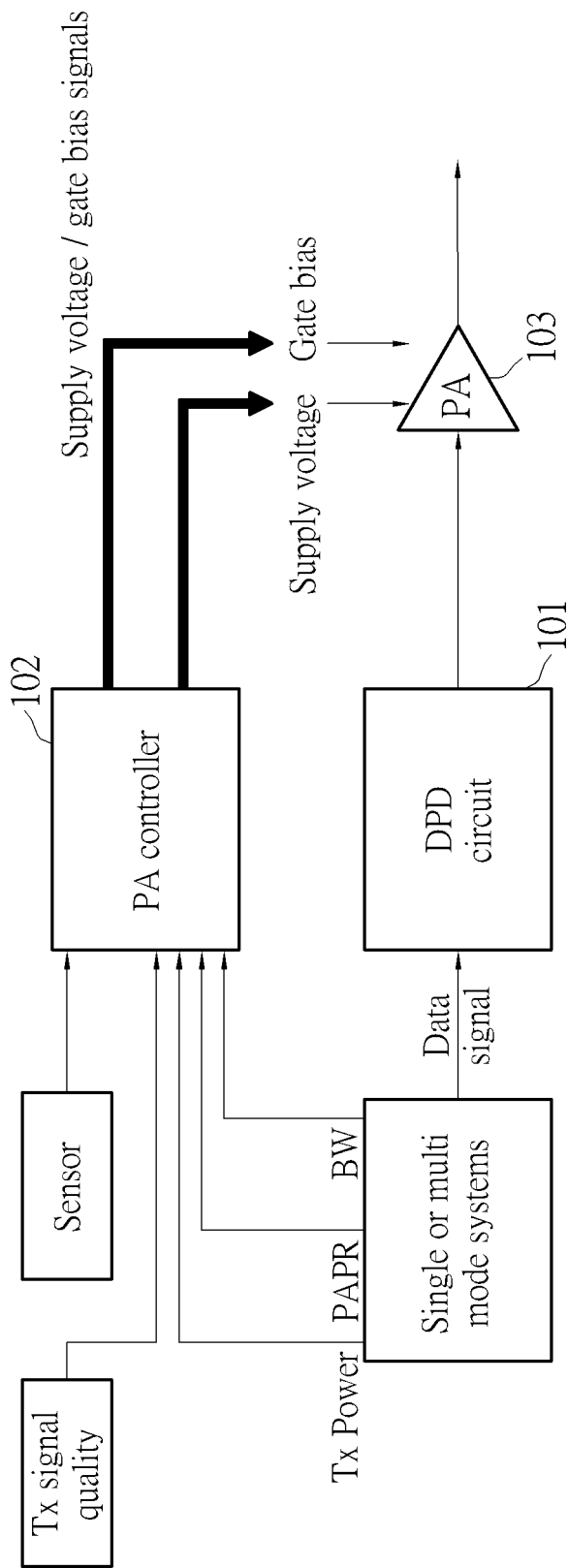
FIG. 2 is a schematic diagram of an operation of the PA controller according to the present disclosure.

Reference is made to FIG. 2, which illustrates a schematic diagram of an operation of the PA controller 102 according to the present disclosure. In an embodiment, the electronic device 10 further includes a sensor (e.g. temperature sensor). The PA controller 102 generates the supply voltage and bias according to system parameter(s). The system parameters include a signal power, a peak-to-average power ratio (PAPR), a bandwidth that the electronic device 10 applied with, a detecting result of the sensor, a signal quality (e.g. error vector magnitude (EVM) and adjacent channel leakage power ratio (ACLR)), or any combination thereof. With such manner, the supply voltage and bias generated by the PA controller 102 to the PA 103 can be dynamically adjusted, so as to save system power and current of the electronic device 10.

For example, the PA controller 102 may generate the supply voltage and bias to the PA according to a temperature detected by the sensor. Based on the temperature is high, low or over a threshold (i.e. design preferably with characteristics of the PA 103), the PA controller 102 generates different supply voltages and biases to the PA 103.

On the other hand, different supply voltages and biases affect PA characteristic, such as PA linearity. Based on the PA linearity, the PA controller 102 could accordingly adjust the supply voltage and bias, so as to realize power and current saving.

Figure 3:
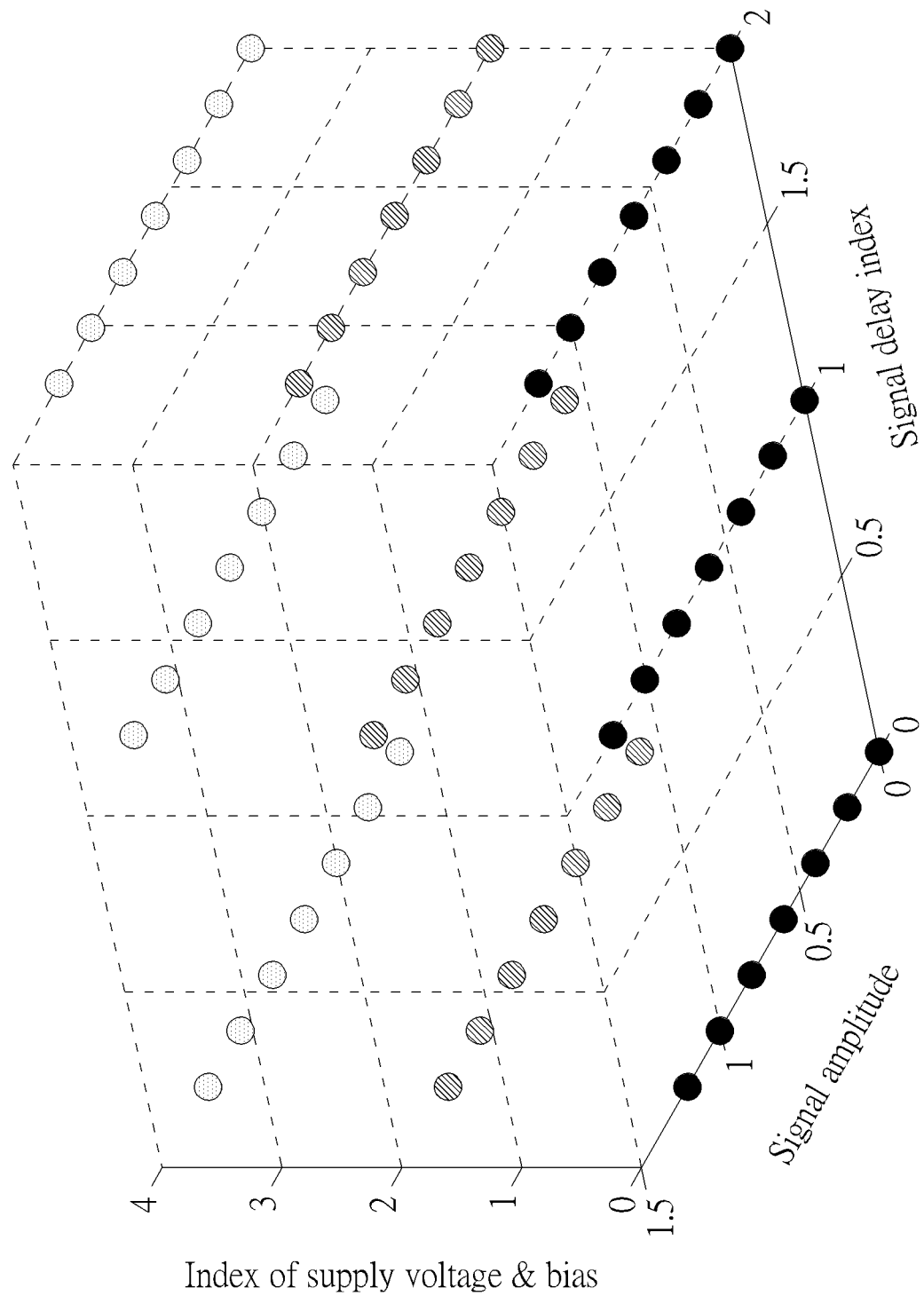
FIG. 3 is a schematic diagram of a 3-dimension LUT according to the present disclosure.

Detailed operation for memory effect reduction is as follows. Referring back to FIG. 1, the LUT tracking circuit 104 receives the signal outputted from the PA 103 (hereafter called output signal) via the feedback path and also receives the signal inputted to the memory DPD circuit 101 (hereafter called input signal) via a reference path. Please also refer to FIG. 3, which is a schematic diagram of a 3-dimension LUT according to the present disclosure. The LUT established by the LUT tracking circuit 104 includes parameters of "input signal delay", "supply voltage and bias", and "input signal amplitude". The LUT tracking circuit 104 obtains the "supply voltage and bias" from the PA controller 102, the "input signal delay" from a bandwidth of the input signal on the reference path, and "input signal amplitude" from the input signal on the reference path.

Note that, the "input signal delay" is associated with the bandwidth of the input signal, which is a factor to reduce or eliminate memory effect of the PA. That is, the 3-dimension LUT takes memory effect into consideration. If the LUT is established based on the "input signal amplitude" only, the LUT is applied for memoryless nonlinear PA only.

For establishment operation, the LUT tracking circuit 104 performs real-time signal tracking to derive the 3-dimension LUT. In detail, the LUT tracking circuit 104 uses an adaptive algorithm (e.g. least mean square (LMS) or recursive least squares (RLS) algorithm) with auto-correlation of the input signal on the reference path, and cross-correlation of the input signal and output signal on the feedback path, so as to compute sample points of the 3-dimension LUT each represents a polynomial value for polynomial function expression.

Moreover, as abovementioned, the supply voltage and bias provided by the PA controller 102 significantly affects PA characteristics. In an embodiment, the LUT tracking circuit 104 performs the signal tracking for the "input signal delay" and "input signal amplitude" to derive the 2-dimension LUT under a specific supply voltage and bias. That is, for each supply voltage and bias, the LUT tracking circuit 104 may establish a corresponding 2-dimension LUT. In a word, the LUT tracking circuit 104 is adaptively modeling the PA nonlinearity based on the supply voltage and bias. In other words, with PA characteristic change, which is caused by the temperature, signal power, PAPR and the input signal bandwidth and/or signal quality, the LUT tracking circuit 104 shall updates the LUT accordingly.

Referring back to FIG. 3, the "supply voltage and bias" is represented as different levels (marked as "index"="0"-"4"). With different index values of "supply voltage and bias", the 2-dimension LUT is corresponding to different "input signal delay" to "input signal amplitude" planes.

The input signal delay is also represented as different levels (marked as "index"="0"-"2"). The index value of "input signal delay" is determined according to the input signal bandwidth to the memory DPD circuit 101. For example, when the input signal is in 10~20 MHz, the index value of "input signal delay" is "0", and when the input signal is in 100 MHz, the index value of "input signal delay" could be "5", depending on the system design.

In an embodiment, the LUT tracking circuit 104 could active/deactivate the signal tracking and LUT updating according to whether the PA characteristics is critically changed or not (e.g. the temperature change is small/huge).

After the 3-dimension LUT is established, the memory DPD circuit 101 applies the 3-dimension LUT to generate a pre-distorted signal whose value is substantially equal to or is aimed to be equal to an inversed polynomial function but with low-complexity with sample points of the 3-dimension LUT. In addition, the memory DPD circuit 101 may further perform interpolation operation, to calculate a smooth inversed polynomial function. After that, the memory DPD circuit 101 generates the pre-distorted signal with the inversed polynomial function and transmits the pre-distorted signal to the PA for linearization, so as to improve AM-AM and AM-PM distortion of the PA caused by the memory effect.

In detail, the memory DPD circuit 101 determines which 2-dimension LUT should be used for computing the inversed polynomial function base on the supply voltage and bias level. As abovementioned, based on the different supply voltage and bias level, the memory DPD circuit 101 obtains the index value of the "supply voltage and bias" (e.g. the supply voltage and bias index=0), and then looks up the corresponding 2-dimension plane (namely "input signal delay" to "input signal amplitude"). Moreover, the memory DPD circuit 101 determines the index value of the "input signal delay" based on the input signal bandwidth. For example, as abovementioned, assumed that the input signal bandwidth range is 10~20 MHz, the input signal delay index=0, which means no memory effect. The memory DPD circuit 101 applies the sample points on the input signal amplitude axis at input signal delay index=0 and supply voltage and bias index=0 (assumed supply voltage and bias level) for generating the inversed polynomial function.

In other embodiment, with input signal delay index=2, which means that the memory effect occurs, the memory DPD circuit 101 applies the sample points on the input signal amplitude axis at input signal delay index=0, 1 and 2, and supply voltage and bias index=0, for generating the inversed polynomial function for memory effect elimination.

The abovementioned steps of the operations including suggested steps can be realized by means that could be a hardware, a software, or a firmware known as a combination of a hardware device and computer instructions and data that reside as read-only software on the hardware device or an electronic system. Examples of hardware can include analog, digital and mixed circuits known as microcircuit, microchip, or silicon chip. Examples of the electronic system can include a system on chip (SOC), system in package (SiP), a computer on module (COM) and the electronic device 10.

In conclusion, the present invention is addressed at LUT based memory DPD for low-complexity PA linearization. In detail, the LUT is established not only with input signal amplitude, but also input signal delay associated to the memory effect and PA supply voltage and bias associated to PA characteristic, for real-time modeling the PA nonlinearity. With the adaptive LUT scheme of the present invention, memory effect can be reduced or eliminated, so as to realize current saving.

Those skilled in the art will readily observe that numerous modifications and alterations of the device and method may be made while retaining the teachings of the invention.

Accordingly, the above disclosure should be construed as limited only by the metes and bounds of the appended claims.

What is claimed is:

1. A method of dynamically adjusting a supply voltage and bias for a power amplifier (PA) of an electronic device by a PA controller of the electronic device, the method comprising:
   determining the supply voltage and bias for the PA according to input signal power, peak-to-average power ratio (PAPR), input signal bandwidth, a detecting result of a sensor of the electronic device, an input signal quality, or any combination thereof;
   providing the determined supply voltage and bias to a LUT tracking circuit to adaptively model PA nonlinearity by the LUT tracking circuit; and
   adjusting the supply voltage and bias by the PA controller.

2. The method of claim 1, wherein the input signal quality includes at least one of an error vector magnitude (EVM) and an adjacent channel leakage power ratio (ACLR), while the sensor includes a temperature sensor.

* * * * *